United States Patent
Park et al.

(10) Patent No.: US 7,778,094 B2
(45) Date of Patent: Aug. 17, 2010

(54) SEMICONDUCTOR MEMORY DEVICE AND LATENCY SIGNAL GENERATING METHOD THEREOF

(75) Inventors: Kwang-Il Park, Yongin-si (KR);
Young-Hyun Jun, Seoul (KR);
Seong-Jin Jang, Seongnam-si (KR);
Ho-Young Song, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 185 days.

(21) Appl. No.: 12/219,816

(22) Filed: Jul. 29, 2008

(65) Prior Publication Data

US 2008/0291753 A1 Nov. 27, 2008

Related U.S. Application Data

(63) Continuation of application No. 11/416,077, filed on May 3, 2006, now Pat. No. 7,453,745.

(30) Foreign Application Priority Data

May 3, 2005 (KR) .............. 10-2005-0037256
Apr. 17, 2006 (KR) .............. 10-2006-0034717

(51) Int. Cl.
*G11C 7/00* (2006.01)
(52) U.S. Cl. .............. 365/193; 365/194; 365/189.06
(58) Field of Classification Search .............. 365/191, 365/193, 194, 189.06
See application file for complete search history.

(56) References Cited

U.S. PATENT DOCUMENTS

| | | | | |
|---|---|---|---|---|
| 5,959,930 A | * | 9/1999 | Sakurai | 365/230.03 |
| 6,215,710 B1 | * | 4/2001 | Han et al. | 365/193 |
| 6,335,901 B1 | * | 1/2002 | Morita et al. | 365/233.1 |
| 6,381,194 B2 | | 4/2002 | Li | |
| 6,795,906 B2 | * | 9/2004 | Matsuda | 711/167 |
| 7,362,648 B2 | * | 4/2008 | Park et al. | 365/230.03 |
| 7,453,745 B2 | * | 11/2008 | Park et al. | 365/193 |
| 2001/0014053 A1 | | 8/2001 | Li | |
| 2003/0002316 A1 | | 1/2003 | Morita et al. | |
| 2003/0217303 A1 | | 11/2003 | Chua-Eoan et al. | |
| 2005/0024972 A1 | | 2/2005 | Schaefer | |

(Continued)

FOREIGN PATENT DOCUMENTS

JP 2006120307 * 5/2006

(Continued)

OTHER PUBLICATIONS

German Office Action dated Jun. 2, 2008.

(Continued)

*Primary Examiner*—Viet Q Nguyen
(74) *Attorney, Agent, or Firm*—Harness, Dickey & Pierce, P.L.C.

(57) ABSTRACT

A latency signal generating method and a corresponding semiconductor memory device, among other things, are disclosed. Such a method includes: receiving a clock signal for the semiconductor memory device; receiving a mode characterization signal; providing the DQS; and adapting the duration of a preamble state of the DQS according to the mode characterization signal to promote conformance of a strobe state of the DQS with the clock signal.

20 Claims, 9 Drawing Sheets

U.S. PATENT DOCUMENTS

| | | |
|---|---|---|
| 2005/0047246 A1 | 3/2005 | Kyung |
| 2005/0122796 A1 | 6/2005 | Jung et al. |
| 2006/0085662 A1 | 4/2006 | Chua-Eoan et al. |

FOREIGN PATENT DOCUMENTS

| | | |
|---|---|---|
| JP | 2006313616 * | 11/2006 |
| KR | 10-1999-0015872 | 3/1999 |
| KR | 10-2001-0077601 | 8/2001 |
| KR | 10-2003-0078307 | 10/2003 |
| KR | 10-2004-0090842 | 10/2004 |
| KR | 10-2001-0036041 | 5/2007 |

OTHER PUBLICATIONS

Korean Notice of Allowability dated Jul. 27, 2007.
JEDEC Standard "Double Data Rate (DDR) SDRAM Specification," JESD79D, Jan. 2004.

* cited by examiner

SEMICONDUCTOR MEMORY DEVICE AND LATENCY SIGNAL GENERATING METHOD THEREOF

PRIORITY STATEMENT

This is a continuation of U.S. application Ser. No. 11/416,077 filed May 3, 2006 now U.S. Pat. No. 7,453,745; the entire contents of which are hereby incorporated by reference. This application claims the benefit of Korean Patent Application No. 2005-37256, filed May 3, 2005 and Korean Patent Application No. 06-34717 filed Apr. 17, 2006, the entire contents of which are hereby incorporated herein by reference.

BACKGROUND

1. Field of the Invention

The present invention relates to a semiconductor memory device and a latency signal generating method thereof.

2. Description of the Related Art

A conventional semiconductor memory device generates data and a data strobe signal synchronized with a clock signal received from an external source during a read operation. The data strobe signal exhibits states including a preamble state and a strobe state, and the preamble state is generated before the strobe state. Data is not outputted while the preamble state is exhibited. Data is outputted when the strobe state is exhibited. Typically, the preamble state is exhibited during one clock cycle.

SUMMARY

One or more embodiments of the present invention provide a semiconductor memory device in which the generation cycle for a preamble state of the data strobe signal is variable.

One or more embodiments of the present invention provide a latency signal generating method of a semiconductor memory device in which the generation cycle for the preamble state of the data strobe signal is variable.

An embodiment of the present invention provides a method for generating a latency signal for a semiconductor memory device, the method comprising: setting a CAS latency signal, a burst length signal, and a preamble cycle signal in response to a code signal during a mode setting operation; and generating a data strobe latency signal which is activated earlier by a cycle corresponding to the preamble cycle signal of before data stored in the memory cell array is outputted to an external portion at a cycle corresponding to the CAS latency signal and which is inactivated after maintaining an activation period of the preamble cycle signal by a cycle obtained by adding a cycle corresponding to the burst length signal to a cycle corresponding to the preamble cycle signal; and delaying onset of an activation period of the data strobe latency signal by a cycle corresponding to the preamble cycle signal to generate a data latency signal.

An embodiment of the present invention provides an apparatus for implementing such a method.

Additional features and advantages of the present invention will be more fully apparent from the following detailed description of example embodiments, the accompanying drawings and the associated claims.

BRIEF DESCRIPTION OF THE DRAWINGS

The accompanying drawings are intended to depict example embodiments of the present invention and should not be interpreted to limit the scope thereof. The accompanying drawings are not to be considered as drawn to scale unless explicitly noted.

The above and other features and advantages of the present invention will become more apparent to those of ordinary skill in the art by describing in detail example embodiments thereof with reference to the attached drawings in which.

DETAILED DESCRIPTION OF EXAMPLE EMBODIMENTS

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

The present invention will now be described more fully hereinafter with reference to the accompanying drawings, in which example embodiments of the present invention are shown. The present invention may, however, be embodied in different forms and should not be construed as limited to the example embodiments set forth herein. Rather, these example embodiments are provided so that this disclosure will be thorough and complete, and will fully convey the scope of the present invention to those skilled in the art. Like numbers refer to like elements throughout the specification.

In developing the present invention, the following observations were made. As semiconductor memory devices attain higher speeds, there is a problem in the Related Art, namely that the strobe state of a data strobe signal (that requires one clock cycle to generate the preamble state) cannot be exactly applied to a receiving portion of a semiconductor memory device. If the generation cycle of the preamble state is increased to solve the above problem, the strobe state can be exactly applied to the receiving portion. However, increasing the generation cycle of the preamble state without considering an operating frequency of the semiconductor memory device may cause an abnormal operation. Thus, there is a need for the semiconductor memory device that can generate the data strobe state so as to have an adjustable duration of the preamble state, where such adjustment is obtained by adjusting the period of the clock cycle in which the preamble state is generated. One or more embodiments of the present invention provide such adjustability in the generation of the preamble state of the strobe signal (DQS).

Figure 1:
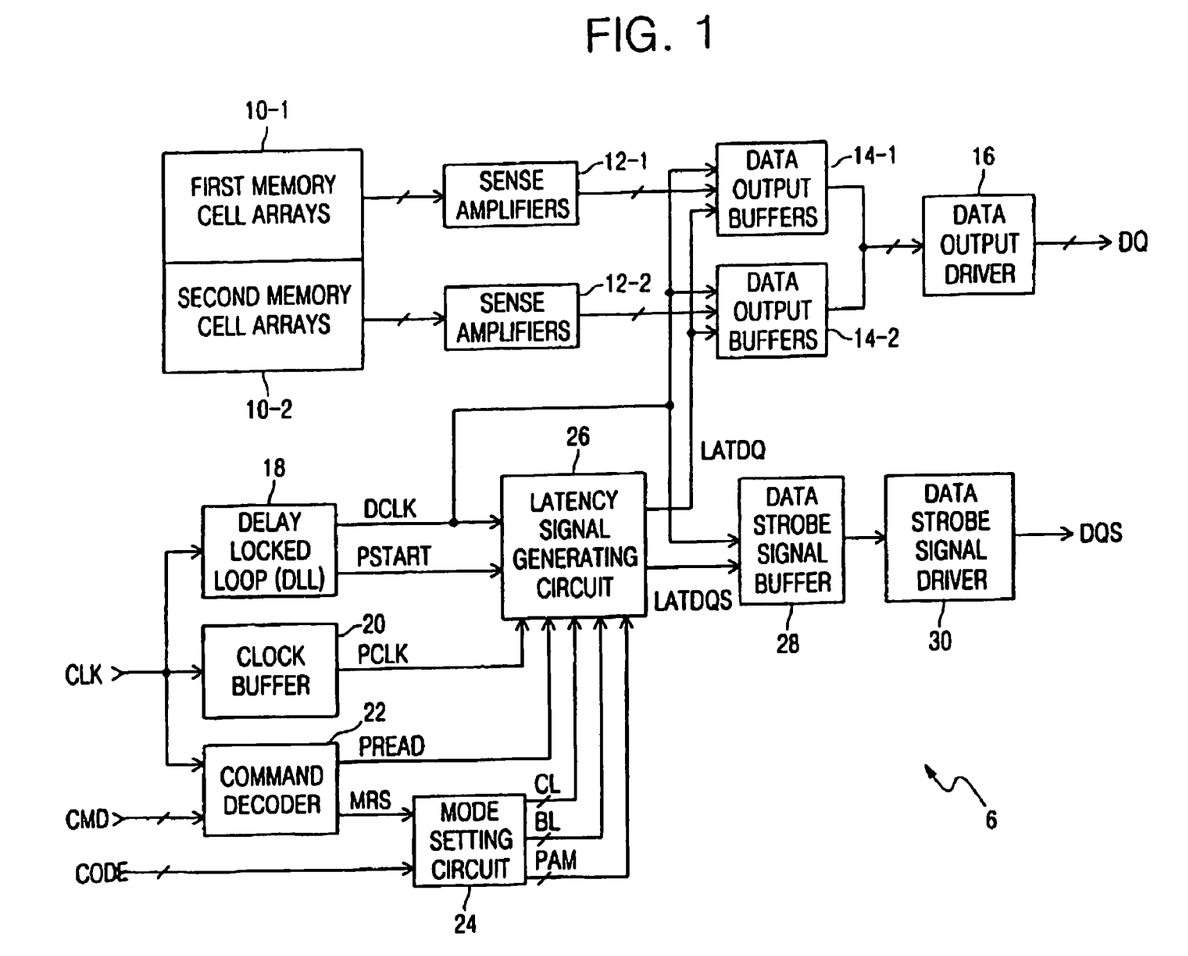
FIG. 1 is a block diagram illustrating a semiconductor memory device according to an example embodiment of the present invention.

FIG. 1 is a block diagram illustrating a semiconductor memory device 6 according to an embodiment of the present invention. The semiconductor memory device 6 includes memory cell arrays 10-1 and 10-2, sense amplifiers 12-1 and 12-2, data output buffers 14-1 and 14-2, a data output driver 16, a delay locked loop (DLL) 18, a clock buffer 20, a command decoder 22, a mode setting circuit 24, a latency signal generating circuit 26, a data strobe signal buffer 28, and a data strobe signal driver 30. The semiconductor memory device 6 receives/outputs data at a double data rate (DDR). For simplicity of disclosure, only components related to the read operation are shown in FIG. 1.

In FIG. 1, CLK, CMD, and CODE denote a clock signal, a command signal, and a code signal which are received from an external (relative to what is depicted in FIG. 1) source, respectively. The code signal CODE is applied through an address pin (not shown) of the semiconductor memory device 6. DQ and DQS denote data and a data strobe signal (having at least preamble and strobe states) which are outputted to external recipients, respectively. PSTART is a signal which is enabled during a time period when the clock signal CLK is synchronized with a delay clock signal DCLK by an operation of the delay locked loop 18.

Functions of the components of FIG. 1 will be explained below.

A memory cell portion of the semiconductor memory device 6 includes the first and second memory cell arrays 10-1 and 10-2 and outputs data respectively stored in the first and second memory cell arrays during the read operation. The sense amplifiers 12-1 and 12-2 amplify and output data (that was received from the first and second memory cell arrays 12-1 and 12-2) during the read operation, respectively. The output data buffer 14-1 buffers and outputs data outputted from the sense amplifier 12-1 in response to the delay clock signal DCLK and a latency signal LATDQ, and the output data buffer 14-2 buffers and outputs data outputted from the sense amplifier 12-2 in response to an inverted version of the delay clock signal DCLK and the latency signal LATDQ. The data output driver 16 drives data (received from the data output buffers 14-1 and 14-2) to generate data DQ.

The delay locked loop 18 receives the clock signal CLK to generate the delay clock signal DCLK and generates the start signal PSTART when the clock signal CLK is synchronized in phase with the delay clock signal DCLK. The clock buffer 20 buffers the clock signal CLK to generate a buffered clock signal PCLK. The command decoder 22 decodes a command CMD received from an external source to generate a read command PREAD and a mode setting command MRS in response to the clock signal CLK. The mode setting circuit 24 receives the code signal CODE and sets a CAS latency signal CL, a burst length signal BL and a preamble cycle signal PAM in response to the mode setting signal MRS.

The latency signal generating circuit 26 can do the following: generate the data latency signal LATDQ whose initial value is set in response to the start signal PSTART; operate in response to the buffered clock signal PCLK and the delay clock signal DCLK; become activated in response to the CAS latency signal CL and the read command PREAD; become inactivated after a time period corresponding to how long it takes for the burst length signal BL to lapse; and generate a data strobe latency signal LATDQS which is activated in response a signal obtained by subtracting the preamble cycle signal PAM from the CAS latency signal CL and the read command PREAD and then is inactivated after a time period obtained by adding the preamble cycle signal PAM to the period of time that it takes for the burst length signal BL to lapse. The data strobe signal buffer 28 buffers the delay clock signal DCLK (in response to the data strobe latency signal LATDQS) to generate the buffered delay clock signal DCLK. The data strobe signal driver 30 drives the buffered delay clock signal DCLK to generate a data strobe signal DQS.

The semiconductor memory device 6 of FIG. 1 varies the preamble cycle signal PAM in response to the mode setting command MRS during the mode setting operation. Thus, it is possible to generate a data output strobe state that can exhibit different preamble state cycle lengths (periods) depending on the operating frequency (the inverse of the period for CLK) of the semiconductor memory device 6.

Figure 2:
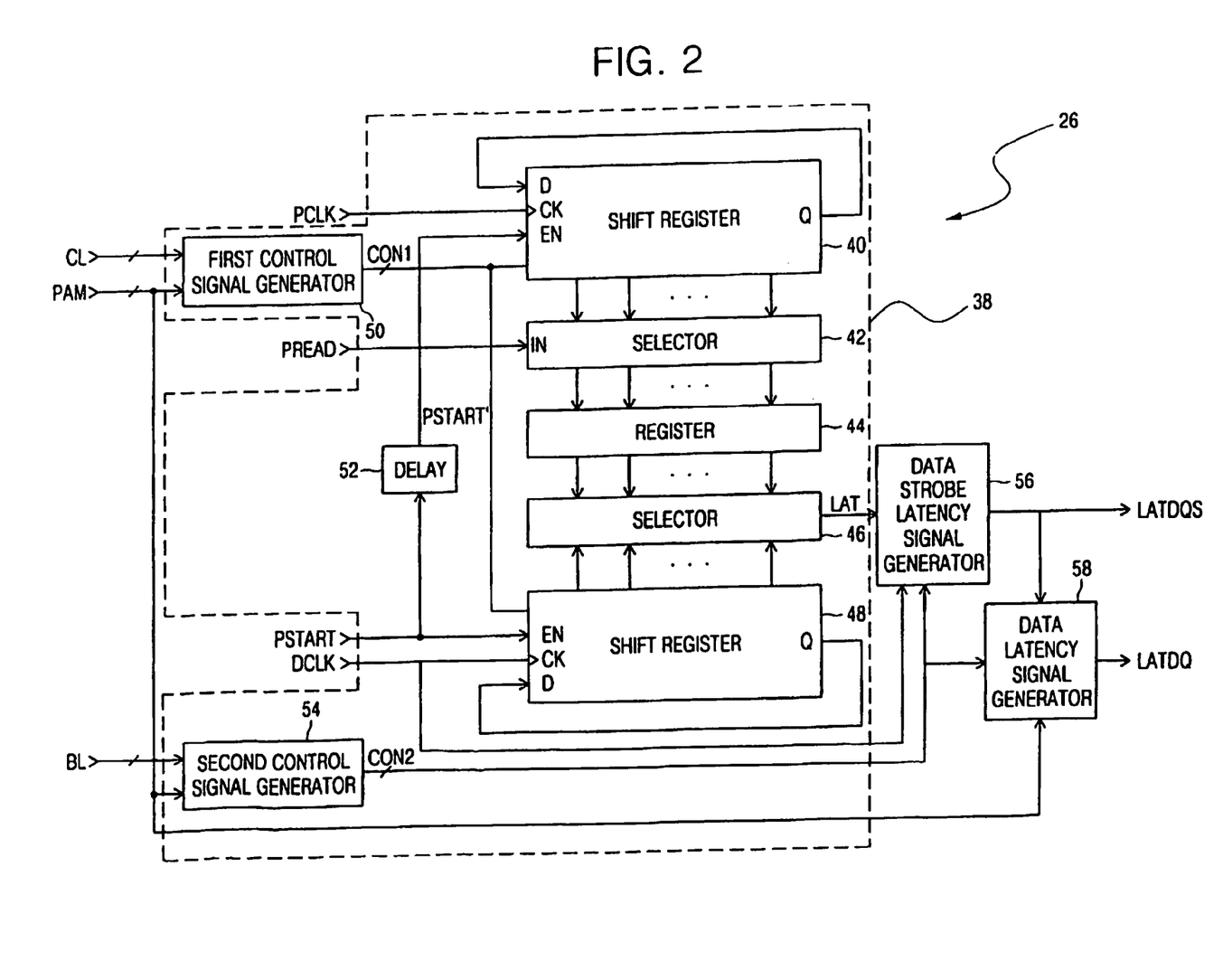
FIG. 2 is a block diagram illustrating the latency signal generating circuit (according to an example embodiment of the present invention) of the semiconductor memory device of FIG. 1.

FIG. 2 is a block diagram (according to an example embodiment of the present invention) illustrating in more detail the latency signal generating circuit 26 of the semiconductor memory device 6 of FIG. 1

The latency signal generating circuit 26 includes a latency signal generator 38, a data strobe latency signal generator 56, and a data latency signal generator 58. Shift registers 40 and 48, selectors 42 and 46, a register 44, first and second control signal generators 50 and 54, and a delay 52 are included within the latency signal generator 38.

Functions of the components of FIG. 2 will be explained below.

The first control signal generator 50 subtracts the preamble cycle signal PAM from the CAS latency signal CL to generate a control signal CON1. For example, when the CAS latency signal is "1010" and the preamble cycle signal PAM is "0010", the subtractor 50 generates the control signal CON of "1000". The second control signal generator 54 adds a value (obtained by multiplying the preamble cycle signal PAM by 2) to the burst length signal BL to generate a control signal CON2. For example, when the burst length signal BL is "0100" and the preamble cycle signal PAM is "0010", the adder 50 generates the control signal CON2 of "1000". The delay 52 delays the start signal PSTART by a time "tSAC+ tREAD" to generate a delayed start signal PSTART'. Here, the time tSAC denotes a time which the delay clock signal precedes the clock signal CLK, and the time tREAD is the time that it takes until the command decoder generates the read signal PREAD after it receives the command signal CMD representing the read command. The shift register 40 is enabled in response to the delayed start signal PSTART', shifts a signal "10 . . . 0" in response to the buffered clock signal PCLK, and shifts data of corresponding bits in response to the control signal CON1. For example, if the control signal CON1 is "1000", then data of "10000000" is shifted. The selector 42 selects and outputs the read signal PREAD in response to each bit data outputted from the shift register 40. The register 44 stores data outputted from the selector 42 and generates signals r1 to r11. The shift register 48 is enabled in response to the start signal PSTART, shifts a signal "10 . . . 0" in response to the delay clock signal DCLK, and shifts data of corresponding bits in response to the control signal CON1. For example, if the control signal CON1 is "1000", then data of "10000000" is shifted. The selector 46 selects among signals r1 to r11 outputted from the register 44 in response to each bit data outputted from the shift register 48, respectively and outputs the selected signal as the latency signal LAT.

The data strobe latency signal generator 56 generates the data strobe latency signal LATDQS which is activated in response to the latency signal LAT and is inactivated after maintaining the activation state for a time period determined by the control signal CON2. For example, if the control signal CON2 is "1000", then the data strobe latency signal generator 56 extends the activation period of the latency signal LAT by 8 cycles to generate the data strobe latency signal LATDQS.

The data latency signal generator 58 receives the data strobe latency signal LATDQS, and generates the data latency signal LATDQ. The activation period of the data strobe latency signal LATDQS is operated up so as to reduce it by a cycle of the preamble cycle signal PAM to obtain the data latency signal LATDQ.

Accordingly, the latency signal generator circuit 26 (during the read operation) receives the CAS latency signal CL and the preamble cycle signal PAM and generates the data strobe latency signal LATDQS, and generates the data latency signal LATDQ by producing a version of the data strobe latency signal LATDQS whose activation time point is delayed by a cycle of the preamble cycle signal PAM.

Figure 3:
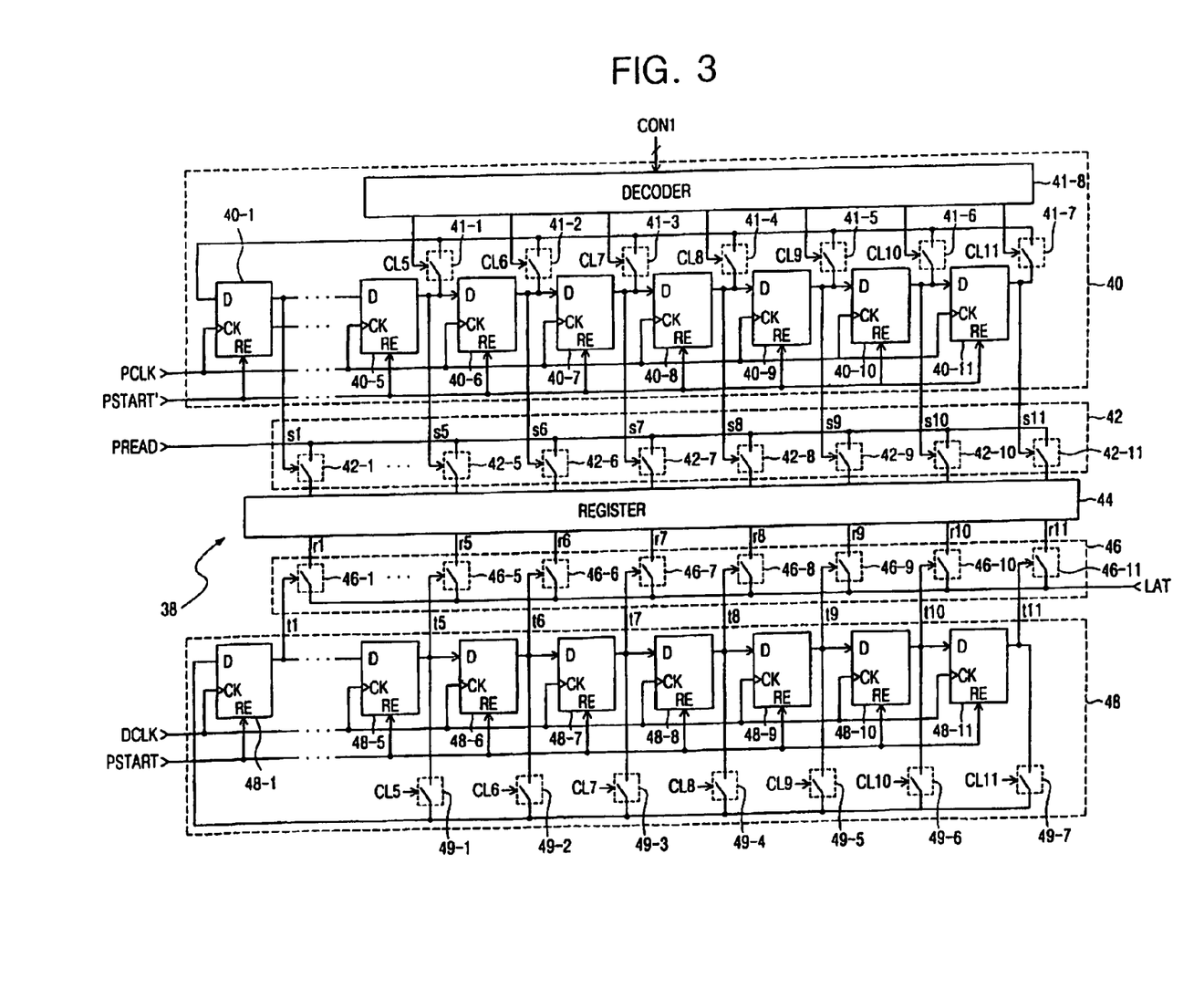
FIG. 3 is a circuit diagram illustrating (according to an example embodiment of the present invention) shift registers and the selectors of the latency signal generator shown in FIG. 2.

FIG. 3 is a circuit diagram (according to an example embodiment of the present invention) illustrating in more detail the shift registers and the selectors of the latency signal generator 38 shown in FIG. 2.

In FIG. 3, the shift register 40 includes D flip flops 40-1 to 40-11, switches 41-1 to 41-7, and a decoder 41-8 which are dependently connected. The selector 42 includes switches 42-1 to 42-11. The selector 46 includes switches 46-1 to 46-11. The shift register 48 includes D flip flops 48-1 to 48-11 and switches 49-1 to 49-7 which are dependently connected.

Functions of the components of FIG. 3 will be described below.

The decoder 41-8 decodes the first control signal CON1 to generate shifting control signals CL5 to CL11. If the first control signal CON1 is "1000", then the shifting control signal CL8 is activated. The switches 41-1 to 41-7 are turned on in response to the shifting control signals CL5 to CL11, respectively. The shift register 40 is initialized to "10 . . . 0" in response to the delayed start signal PSTART', and one of the switches 41-1 to 41-7 is turned on, so that the shifting operation is performed in response to the buffered clock signal PCLK to generate signals s1 to s11. If the switch 41-4 is turned on, then the shift register 40 is initialized to "10 . . . 0", and the shifting operation is performed in response to the buffered clock signal PCLK.

The shift register 48 is initialized to "10 . . . 0" in response to the start signal PSTART, and one of the switches 49-1 to 49-7 is turned on in response to the control signal CON2, so that the shifting operation is performed in response to the delay clock signal DCLK to generate signals t1 to t11. If the switch 49-4 is turned on, then the shift register 48 is initialized to "100000000", and the shifting operation is performed in response to the delay clock signal DCLK. In the way that the switches 42-1 to 42-11 are respectively turned on in response to the signals s1 to s11, one of the switches is turned on to thereby transmit the read signal PREAD.

The register 44 stores a signal transmitted from the switches 42-1 to 42-11 and generates the signals r1 to r11. In the way that the switches 46-1 to 46-11 are respectively turned on in response to the signals t1 to t11, one of the switches is turned on to thereby transmit one of the signals r1 to r11 stored in the register 44 as the latency signal LAT. The activation period of the latency signal LAT is one clock cycle, and a point of time when the data strobe latency signal LAT-DQS is activated depends on a point of time when the latency signal LAT is activated.

FIG. 3 shows that the shift registers 40 and 48 comprise 11 D flip flops, respectively, but when the CAS latency signal CL becomes larger, the shift register is constituted by 12 or more D flip flops. As the number of the D flip flops is increased, the number of the switches is also increased.

Figure 4:
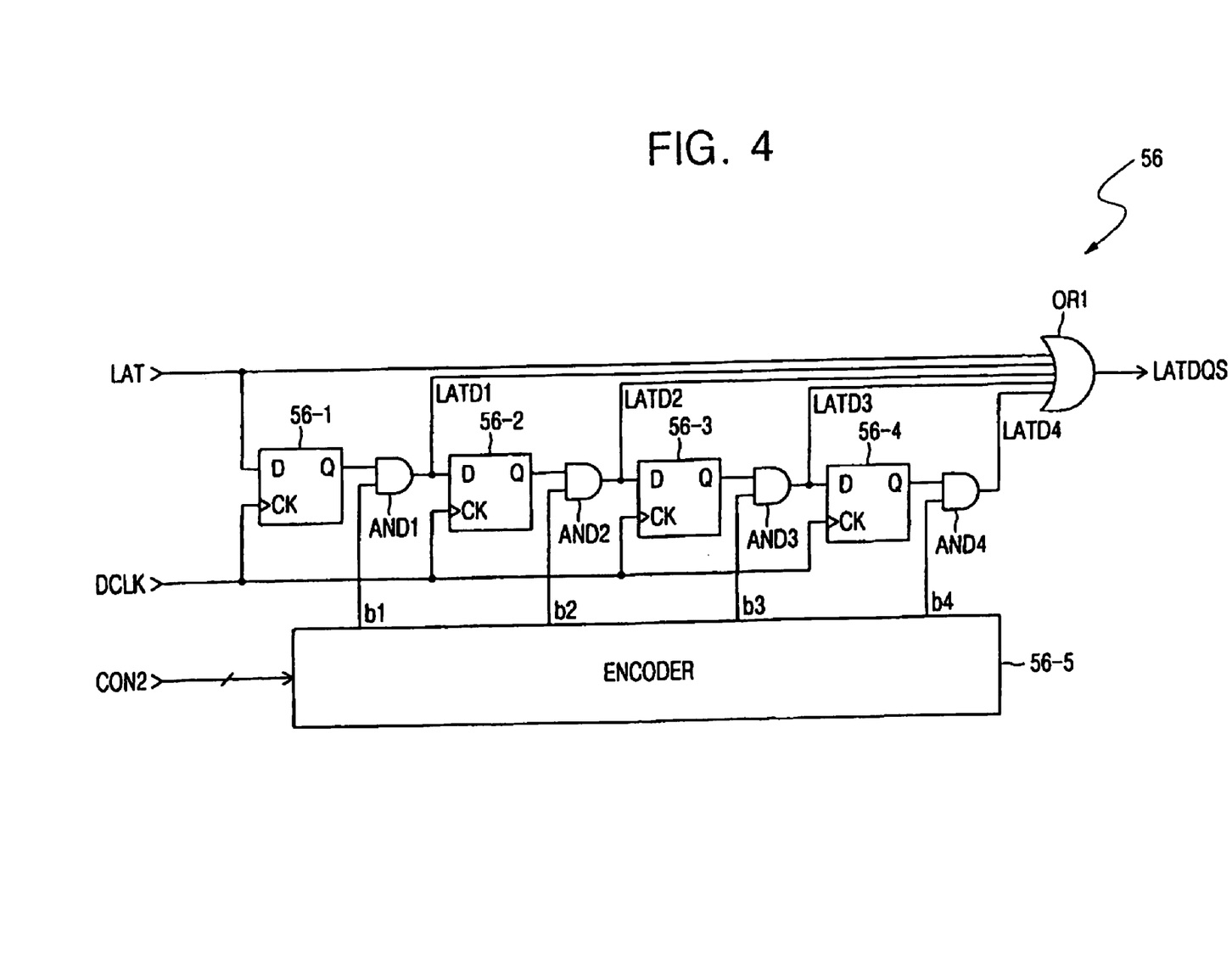
FIG. 4 is a circuit diagram illustrating (according to an example embodiment of the present invention) a data strobe latency signal generator shown in FIG. 2.

FIG. 4 is a circuit diagram (according to an example embodiment of the present invention) illustrating in more detail the data strobe latency signal generator 56 shown in FIG. 2.

The data strobe latency signal generator 56 of FIG. 4 includes D flip flops 56-1 to 56-4, an encoder 56-5, AND gates AND1 to AND4, and an OR gate OR1.

Functions of the components of FIG. 4 will be described below.

The encoder 56-5 encodes the control signal CON2 to generate signals b1 to b4. The signals b1 to b3 are activated when the control signal CON2 is "1000", the signal b1 is activated when the control signal CON2 is "0100", and the signals b1 and b2 are activated when the control signal CON2 is "0110". The D flip flops 56-1 to 56-4 receive the latency signal LAT and output signals of the AND gates AND1 to AND3, delaying them by one clock cycle, respectively. The AND gates AND1 to AND4 operate to logically AND the output signals of the D flip flops 56-1 to 56-4 and the signals b1 to b4, respectively. The OR gates OR1 operates to logically OR the output signals of the D flip flops 56-1 to 56-4 to generate the data strobe latency signal LATDQS.

The D flip flop 56-1 and the AND gate AND1 delay the latency signal LAT by one clock cycle, and the D flip flop 56-2 and the AND gate AND2 further delay the latency signal LAT by one clock cycle (for a net delay of two clock cycles). In this way, it is possible to delay the latency signal LAT by a total of four clock cycles. If the signals b1 to b3 are activated, then the latency signal LAT is delayed by three clock cycles, and thus the activation period of the latency signal LAT is extended by three clock cycles, whereby the activation period of the data strobe latency signal LATDQS is a total four clock cycles. Even though not shown in FIG. 4, a discrete circuit for further extending the activation period of the data strobe latency signal LATDQS may be needed.

FIG. 4 shows the structure of the data strobe latency signal generator 56 which can additionally extend the pulse width of the latency signal LAT by a total of four clock cycles. If a circuit including the D flip flop and the AND gate is dependently added to the configuration of FIG. 4, it is possible to further extend the pulse width of the latency signal LAT by a total of five clock cycles. That is, if five circuits including the D flip flop and the AND gate are dependently connected, it is possible to further extend the pulse width of the latency signal LAT by total five clock cycles. Additional such circuiting can further extend the pulse width as needed.

Figure 5:
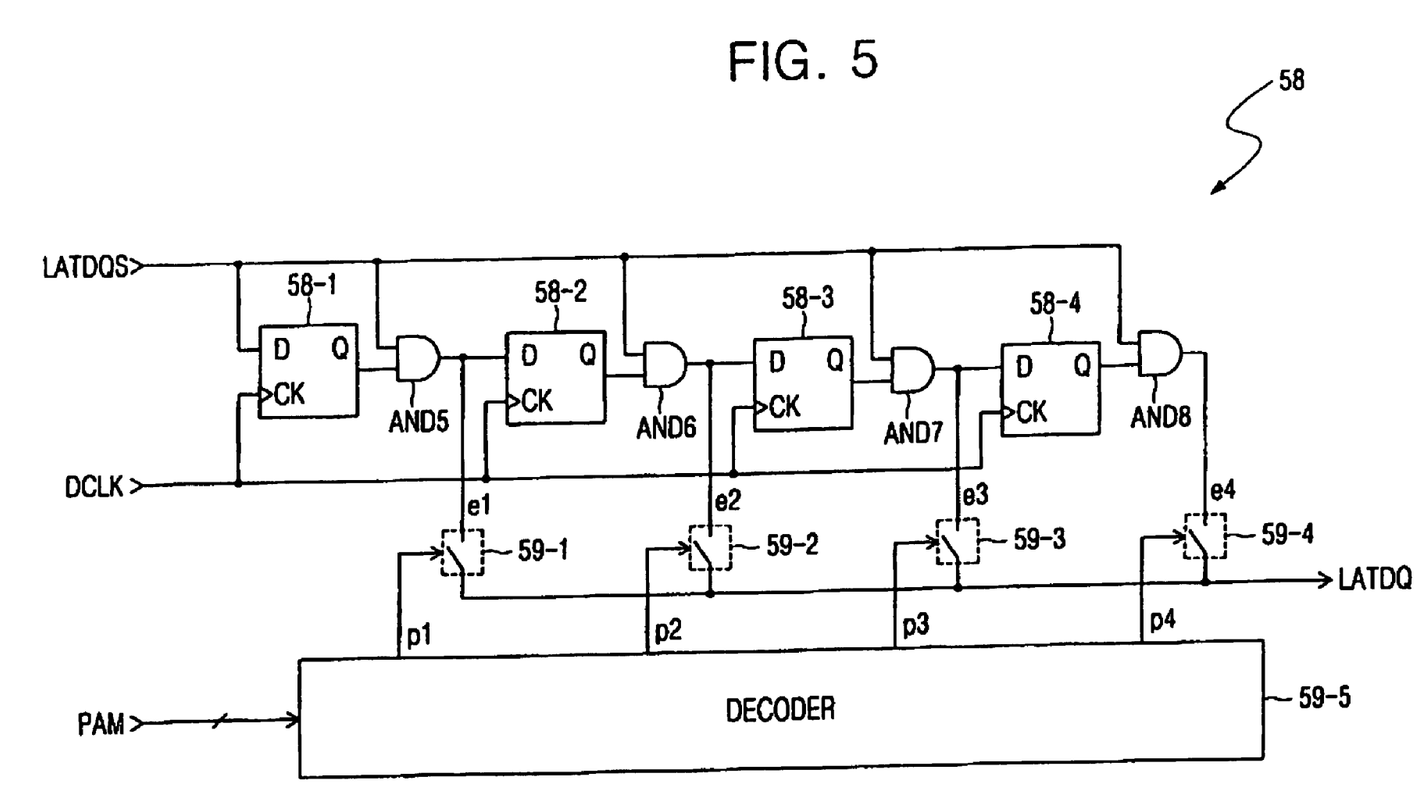
FIG. 5 is a circuit diagram illustrating (according to an example embodiment of the present invention) a latency signal generator shown in FIG. 2.

FIG. 5 is a circuit diagram (according to an example embodiment of the present invention) illustrating in more detail the data latency signal generator 58 shown in FIG. 2.

In FIG. 5, the data latency signal generator includes D flip flops 58-1 to 58-4, switches 59-1 to 59-4, AND gates AND5 to AND8, and a decoder 59-5.

Functions of the components of FIG. 5 will be described below.

The decoder 59-5 decodes the preamble cycle signal PAM to generate signals p1 to p4. The signal p1 is activated when the preamble cycle signal PAM is "0001", the signal p2 is activated when the preamble cycle signal PAM is "0010", and the signal p4 is activated when the preamble cycle signal PAM is "0100". The D flip flops 58-1 to 58-4 receive the data strobe latency signal LATDQS and provide signals to the AND gates AND5 to AND8 and delay them by one clock cycle in response to the delay clock signal DCLK, respectively.

The AND gates AND5 to AND8 operate to logically AND the output signals of the D flip flops 58-1 to 58-4 and the data strobe latency signal LATDQS to generate signals e1 to e4, respectively. The switches 59-1 to 59-4 generate the signals e1 to e4 as the data latency signal LATDQ in response to the signals p1 to p4, respectively. If the preamble cycle signal PAM is "0001", then the signal p1 is activated, so that the switch 59-1 is turned on to generate the signal e1 as the data latency signal LATDQ. That is, the D flip flop 58-1 and the AND gate AND5 delay an activation time point of the data strobe latency signal LATDQS by one clock cycle to generate the signal e1, and the D flip flop 58-2 and the AND gate AND6 further delay an activation time point of the data strobe latency signal LATDQS by one clock cycle (for a net delay of two clock cycles) to generate the signal e2. In this way, it is possible to delay the activation time point of the data strobe latency signal LATDQS by a total of four clock cycles. If the signal p2 is activated, then the switch 59-2 is turned on to generate the signal e2 as the data latency signal LATDQ. The data latency signal LATDQ generated at this time is a signal generated by delaying the activation time point of the data strobe latency signal LATDQS by two clock cycles, and it is a signal in which the activation period of the data latency signal LATDQ is two clock cycles smaller than the activation period of the data strobe latency signal LATDQS.

Figure 6A:
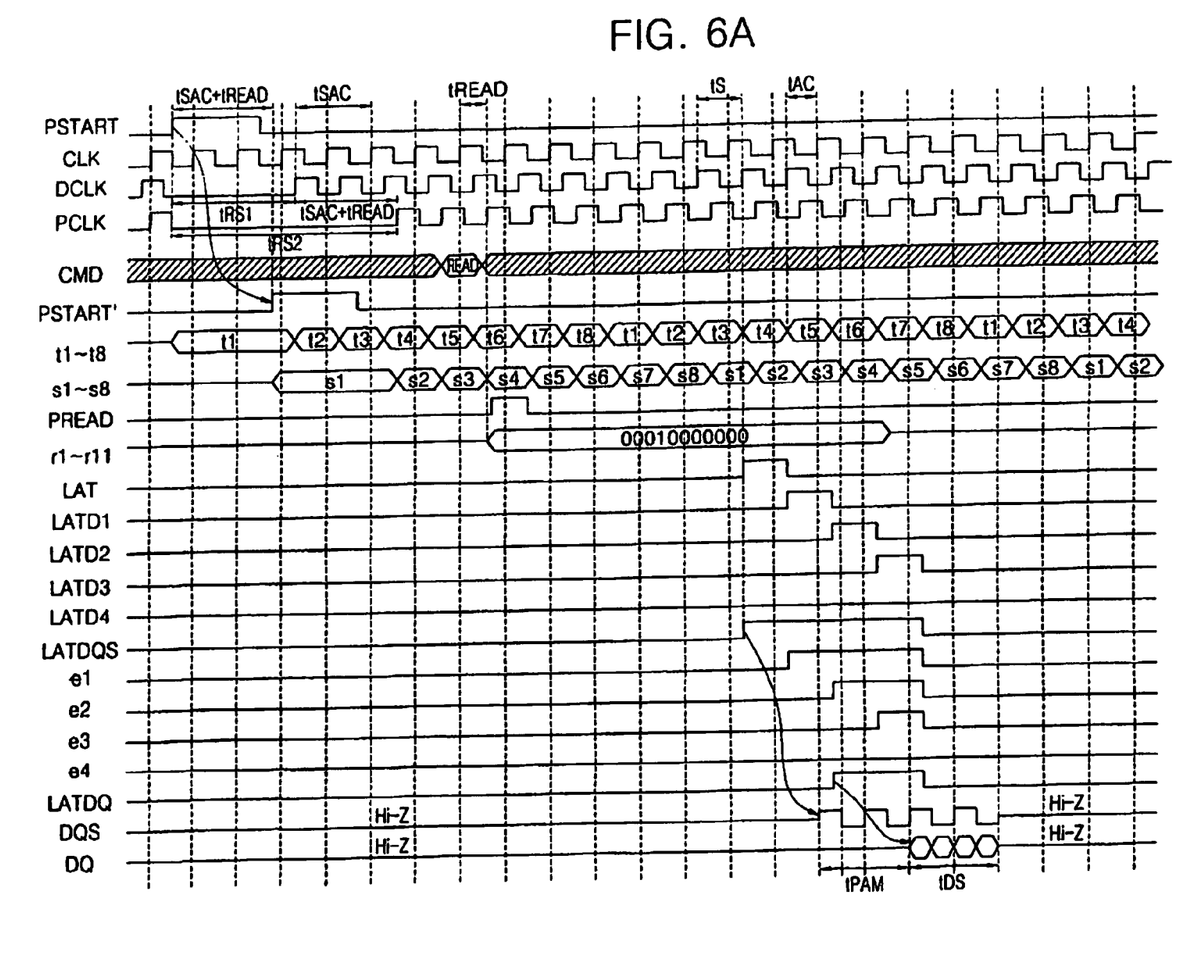
FIGS. 6A and 6B are timing diagrams illustrating (according to an example embodiment of the present invention) an operation of the latency signal generating circuit shown in FIGS. 2 to 5.

FIG. 6A is a timing diagram (according to an example embodiment of the present invention) illustrating an operation of the latency signal generating circuit shown in FIGS. 2 to 5. In particular, FIG. 6A is a timing diagram illustrating an operation of the semiconductor memory device 6 in the context of a specific set of hypothetical non-limiting data in which the CAS latency signal CL is set to "1010", the burst length signal BL is set to "0100", and the preamble cycle signal PAM is set to "0010", that is, the CAS latency is set to 10, the burst length is set to 4, and the preamble cycle is set to 2.

In FIG. 6A, the delay clock signal DCLK is generated when a time tRS1 lapses after the start time PSTART is activated, and the buffered clock signal PCLK when a time tRS2 lapses. A difference between the time tRS1 and the time tRS2 is a time "tSAC+tREAD". Here, the time tREAD represents a time of until the command decoder generates the read signal PREAD after it receives the command signal CMD representing the read command. The time tR represents a time of until the data strobe latency signal LATDQS is generated in response to the delay clock signal DCLK, the time tAC represents a time of until the data strobe signal DQS is generated in response to the delay clock signal DCLK, and the time tSAC represents a sum of the time tAC and the time tS and represents a time that the delay clock signal DCLK precedes the clock signal CLK.

The delay 52 delays the start time PSTART by the time "tSAC+tREAD" to generate the delayed start time PSTART'. The decoder 41-8 decodes the control signal CON1 of "1000" to activate the shifting control signal CL8. The shift register 40 is initialized to "10 . . . 0" in response to the delayed start signal PSTART', and as the switch 41-4 is turned on, a shifting operation is performed one bit by one bit in response to the buffered clock signal PCLK to thereby generate the signals s1 to s8.

As shown in FIG. 6A, the signals s1 to s8 are sequentially activated. The shift register 48 is initialized to "10 . . . 0" in response to the start signal PSTART, and as the switch 49-4 is turned on, the D flip flops 48-1 to 48-8 perform a shifting operation one bit by one bit in response to the delay clock signal DCLK to thereby sequentially activate the signals t1 to t8. When the switch 42-4 (not shown) is turned on by the signal s4, the read signal READ is stored in the register 44, and thus the register 44 generates the output signals r1 to r11 of "0001000000". This signal is maintained until the next signal s4 is activated. The output signal r4 of "1" stored in the register 44 makes the latency signal LAT become "1" when the switch 46-4 is turned on in response to the signal t4. That is, the latency signal LAT is activated during one clock cycle in response to the signal t4.

The encoder 56-5 encodes the control signal CON2 of "1000" to activate the signals b1 to b3. The D flip flop 56-1 and the AND gate AND1 delay the latency signal LAT by one clock cycle to generate a signal LATD1, the D flip flop 56-2 and the AND gate AND2 delay the signal LATD1 by one clock cycle to generate a signal LATD2, and the D flip flop 56-3 and the AND gate AND3 delay the signal LATD2 by one clock cycle to generate a signal LATD3. The OR gate OR1 logical-sums the latency signal LAT and the signals LATD1 to LATD3 to generate the data strobe latency signal LATDQS which extends the activation period of the latency signal LAT by three clock cycles. The decoder 59-5 decodes the preamble cycle signal PAM of "0010" to activate the signal p2. The D flip flop 58-1 and the AND gate AND5 delay the activation period of the data strobe latency signal LATDQS by one clock cycle to generate the signal e1, and the D flip flop 58-2 and the AND gate AND6 delay the activation time point of the signal e1 by one clock cycle to generate the signal e2. The switch 59-2 generates the signal e2 as the data latency signal LATDQ in response to the signal p2.

Accordingly, the activation time point of the data strobe latency signal LATDQS is delayed by a cycle corresponding to the preamble clock cycle PAM to activate the data latency signal LATDQ. So, the data strobe signal DQS which is synchronized with the clock signal CLK during the same time period as the activation period of the data strobe latency signal LATDQS is generated in response to the data strobe latency signal LATDQS. And, synchronized with rising and falling edges of the clock signal CLK within the activation period of the data latency signal LATDQ, four data DQ are sequentially generated. As shown in FIG. 6A, the data strobe signal DQS exhibits states including a preamble state generated during a time period tPAM of two clock cycles and a strobe state generated during the time period tDS of two clock cycles.

Figure 6B:
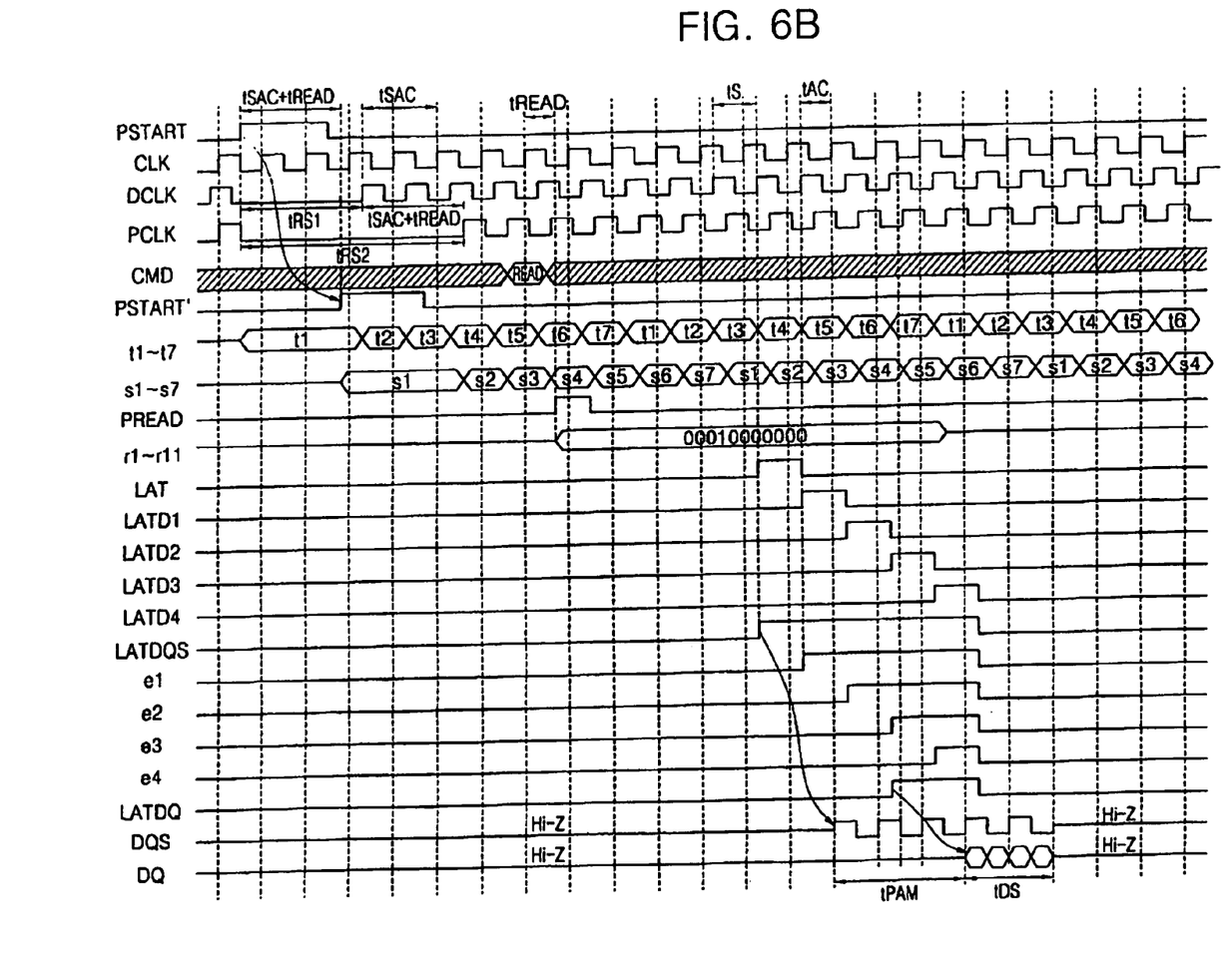

FIG. 6B is a timing diagram (according to an example embodiment of the present invention) illustrating an operation of the latency signal generating circuit shown in FIGS. 2 to 5. In particular, FIG. 6B is a timing diagram illustrating an operation of the semiconductor memory device 6 in the context of a specific set of hypothetical (non-limiting) data in which the CAS latency signal CL is set to "1010", the burst length signal BL is set to "0100", and the preamble cycle signal PAM is set to "0011", that is, the CAS latency is set to 10, the burst length is set to 4, and the preamble cycle is set to 3.

In FIG. 6B, as with FIG. 6A, the signals PSTART, PSTART', DCLK, PCLK, and PREAD are generated.

In FIG. 6B, the decoder 41-8 decodes the control signal CON1 of "0111" to activate the shifting control signal CL8. The shift register 40 is initialized to "10 . . . 0" in response to the delayed start signal PSTART', and as the switch 41-3 is turned on, the D flip flop 40-1 to 40-7 perform the shifting operation one bit by one bit in response to the buffered clock signal PCLK to thereby generate the signals s1 to s7. As shown in FIG. 6B, the signals s1 to s7 are sequentially activated. The shift register 48 is initialized to "10 . . . 0" in response to the start signal PSTART, and as the switch 49-3 is turned on, the D flip flops 48-1 to 48-7 perform the shifting operation one bit by one bit in response to the delay clock signal DCLK to thereby sequentially activate the signals t1 to t7. When the switch 42-4 (not shown) is turned on by the signal s4, the read signal READ is stored in the register 44, and thus the register 44 generates the output signals r1 to r11 of "0001000000". This signal is maintained until the next signal s4 is activated. The output signal r4 of "1" stored in the register 44 makes the latency signal LAT become "1" when the switch 46-4 is turned on in response to the signal t4. That is, the latency signal LAT is activated during one clock cycle in response to the signal t4 and is activated one clock cycle earlier than the latency signal LAT of FIG. 6A.

Continuing the discussion of FIG. 6B, the encoder 56-5 encodes the control signal CON2 of "1010" to activate the signals b1 to b4. As a result, the data strobe latency signal LATDQS which is activated one clock cycle earlier than the data strobe latency signal LATDQS of FIG. 6A and is inactivated at the same time point as the data strobe latency signal LATDQS of FIG. 6A. The decoder 59-5 decodes the preamble cycle signal PAM of "0011" to activate the signal p3. The switch 59-3 generates the signal e3 as the data latency signal LATDQ in response to the signal p3. Accordingly, the activation time point of the data strobe latency signal LATDQS is delayed by three clock cycles corresponding to the preamble clock cycle PAM to activate the data latency signal LATDQ. As shown in FIG. 6B, the data strobe signal DQS exhibits states including the preamble state generated during a time period tPAM of three clock cycles and the strobe state generated during the time period tDS of two clock cycles.

As can be seen in FIGS. 6A and 6B, it is possible to vary the generation cycle of the preamble state of the data strobe latency signal LATDQS by varying the preamble cycle signal PAM.

Figure 7:
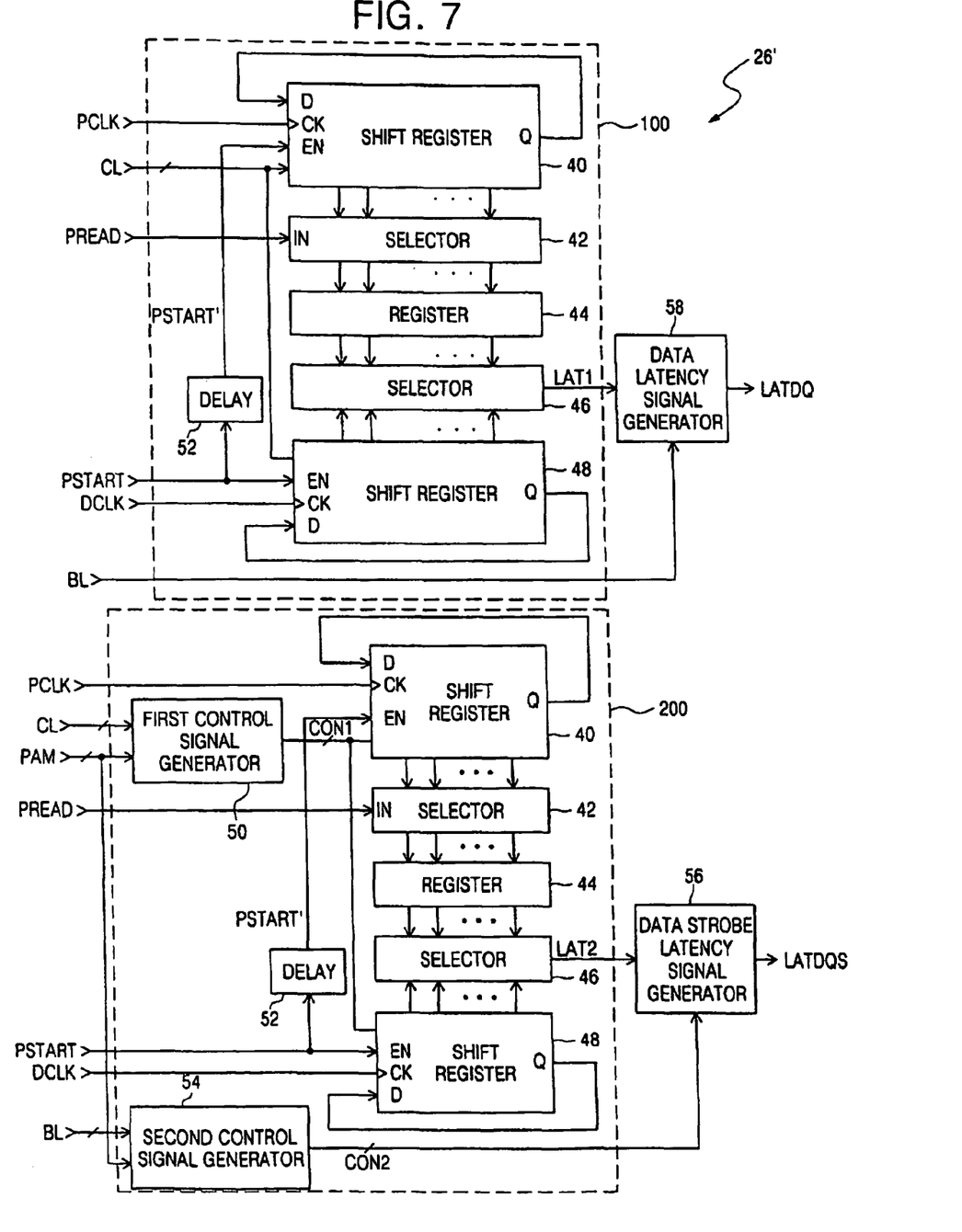
FIG. 7 is a block diagram illustrating an alternative version (according to an example embodiment of the present invention) of the latency signal generating circuit of FIG. 2.

FIG. 7 is a block diagram illustrating an alternative version 26' (according to an example embodiment of the present invention) of the latency signal generating circuit 26 of FIG. 2.

The latency signal generating circuit 26' of FIG. 7 includes a latency signal generator 100 and a latency signal generator 200. The latency signal generator 100 is configured such that the first and the second control signal generators 50 and 54 are removed relative to the configuration of the latency signal generator 38 of FIG. 2 and the latency signal generator 200 is configured substantially the same as the configuration of the latency signal generator 30 of FIG. 2.

The latency signal generating circuit 26' of FIG. 7 is configured such that the latency signal generator 100 and the latency signal generator 200 are separated from each other.

Like reference numerals of FIGS. 2 and 7 denote like parts and perform like operations, and thus description on those will be omitted.

For the latency signal generator 100, the CAS latency signal CL is applied to the shift register 40 as the first control signal. That is, the signal generating circuit 100 generates the data latency signal LATDQ which is activated after a delay corresponding to the clock cycle of the CAS latency signal CL regardless of the preamble cycle signal PAM, and which is inactivated after a time corresponding to the clock cycle of the burst length signal BL.

The data strobe latency signal generating circuit 200 performs the same operation as the latency signal generator 38 of FIG. 2.

Figure 8:
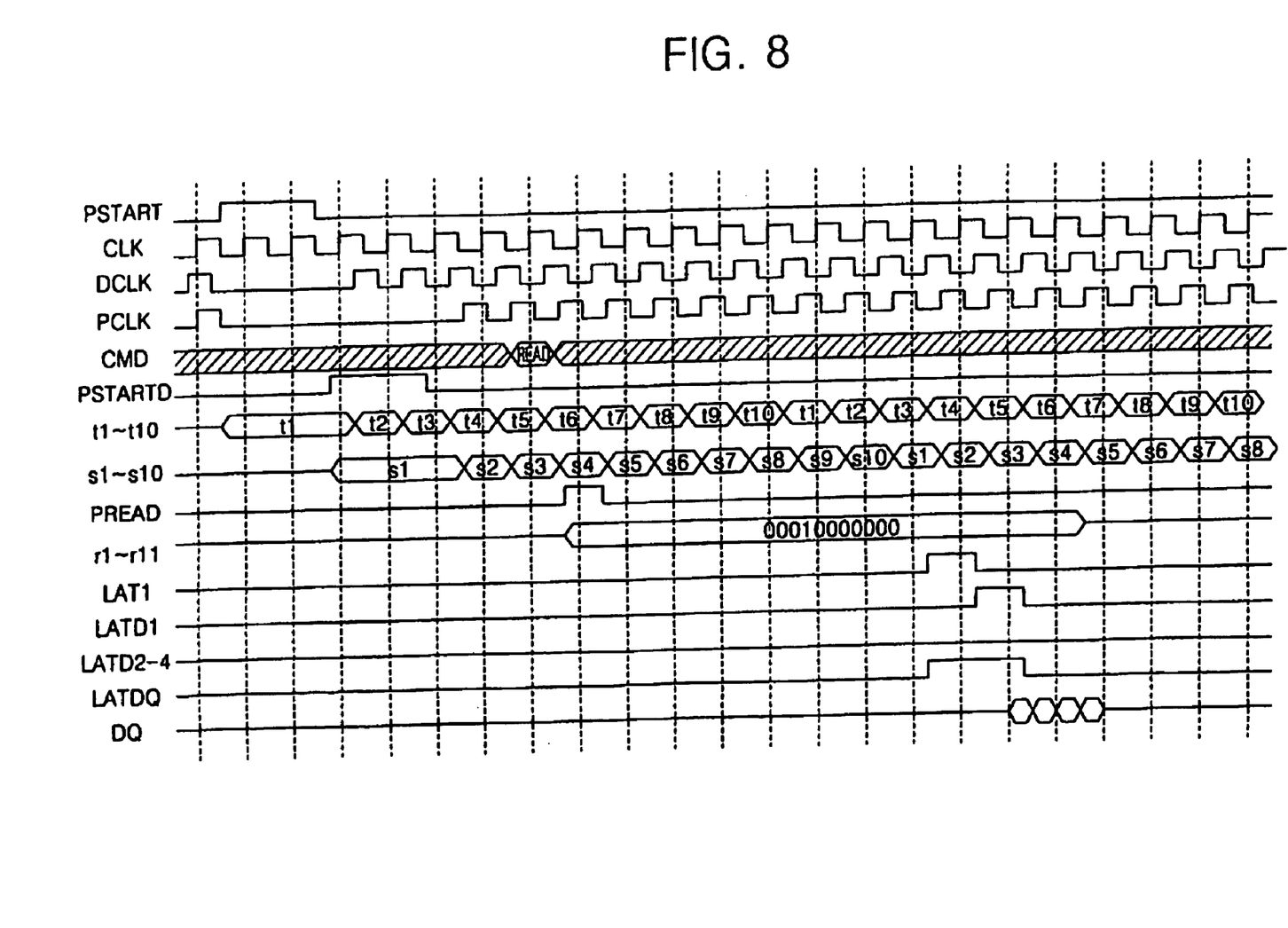
FIG. 8 is a timing diagram illustrating (according to an example embodiment of the present invention) an operation of the latency signal generating circuit of FIG. 7.

FIG. 8 is a timing diagram (according to an example embodiment of the present invention) illustrating an operation of the latency signal generating circuit 26' of FIG. 7. In particular, FIG. 7 is a timing diagram illustrating an operation of a semiconductor memory device (corresponding to the semiconductor memory device 6 as in FIG. 1 albeit including the latency signal generating circuit 26' rather than the latency signal generating circuit 26), in the context of a specific set of hypothetical data in which the CAS latency signal CL is set to "1010", the burst length signal BL is set to "0100", and the preamble cycle signal PAM is set to "0010", that is, the CAS latency is set to 10, the burst length is set to 4, and the preamble cycle is set to 2.

The operation timing of the latency signal generator 200 is the same as that of the timing diagram of FIG. 6A, and thus FIG. 8 is abbreviated relative to FIG. 6A.

Relative to FIG. 8, The first control signal generating circuit 50 of the latency signal generator 200 generates the CAS latency signal CL of "1010" as the control signal CON1. The shift register 40 is initialized to "10 . . . 0" in response to the delayed start signal PSTART' and performs the shifting operation one bit by one bit in response to the buffered clock signal PCLK to generate the signals s1 to s10. Like the timing diagram of FIG. 6A, the signals s1 to s10 are sequentially activated. When the signal s4 is activated, the read signal PREAD is stored in the register 44, and the output signals r1 to r11 of "00010000000" are generated. This signal is maintained until the next signal s1 is activated. The shift register 48 is initialized to "10 . . . 0" in response to the start signal PSTART and performs the shifting operation one bit by one bit in response to the delay clock signal DCLK to sequentially activate the signals t1 to t10. The encoder 56-5 encodes the control signal CON2 of "1000" to activate the signals b1 to b3. The D flip flop 56-1 and the AND gate AND1 delay the latency signal LAT by one clock cycle to generate a signal LATD1. Thus, the OR gate OR1 logical-sums the latency signal LAT and the signal LATD1 to generate the data latency signal LATDQ which extends the activation period of the latency signal LAT by one clock cycle. And, synchronized with rising and falling edges of the clock signal CLK during the same period as the activation period of the data latency signal LATDQ in response to the data latency signal LATDQ, four data DQ are sequentially generated.

The above example embodiments have described semiconductor memory devices which operate at the double data rate, but alternative embodiments of the present invention can be applied to semiconductor memory devices which operate at a single data rate or a quad data rate or higher.

As described above, a semiconductor memory device according to one or more embodiments of the present invention can vary the preamble cycle according to the operating frequency.

As described above, the semiconductor memory device and the latency signal generating method according to two or more respective embodiments of the present invention can vary the generation cycle of the preamble state of the data strobe latency signal according to the operating frequency, thereby improving operation reliability of the semiconductor memory device.

With some example embodiments of the present invention having thus been described, it will be obvious that the same may be varied in many ways. Such variations are not to be regarded as a departure from the spirit and scope of the present invention, and all such modifications are intended to be included within the scope of the present invention.

What is claimed:

1. A semiconductor memory device, comprising:
   a mode setting unit setting a preamble cycle signal in response to a code signal received during a mode setting operation,
   wherein the preamble cycle signal is variably set depending on the operating frequency of the semiconductor memory device.

2. The device of claim 1, wherein the semiconductor memory device further comprises a memory cell array outputting data during a read operation, and a data strobe signal is generated earlier by a cycle corresponding to the preamble cycle signal before the data of the memory cell array is output to the external portion in response to the data strobe signal.

3. The device of claim 2, wherein the mode setting unit further sets a CAS latency signal in response to the code signal received during the mode setting operation, and the data strobe signal is generated earlier by the cycle corresponding to the preamble cycle signal before data stored in the memory cell array is outputted to an external portion at a cycle corresponding to the CAS latency signal.

4. The device of claim 3, wherein the mode setting unit further sets a burst length signal in response to the code signal received during the mode setting operation, and the data strobe signal is generated during a cycle obtained by adding a cycle corresponding to the burst length signal to a cycle corresponding to the preamble cycle signal.

5. The device of claim 4, further comprising:
   a latency signal generating unit for generating the data strobe latency signal which is activated earlier by a cycle corresponding to the preamble cycle signal before the data stored in the memory cell array is outputted to the external portion and which is inactivated after maintaining an activation period of the preamble cycle signal by a cycle obtained by adding a cycle corresponding to the burst length signal to a cycle corresponding to the preamble cycle signal; and
   a data strobe signal generating unit for generating the data strobe signal by the activation period of the data strobe latency signal in response to the data strobe latency signal.

6. The device of claim 5, further comprising,
   a command decoder for decoding an external command signal to generate at least one of a mode setting signal for the mode setting operation and a read signal for the read operation;
   a delay locked loop for generating a delay clock signal synchronized with an external clock signal and generating a start signal when the external clock signal is synchronized with the delay clock signal; and
   a clock buffer for buffering the external clock signal to generate a buffered clock signal.

7. The device of claim 6, wherein the delay clock signal and the buffered clock signal have the same frequency as the external clock signal, and the delay clock signal is generated a reference time earlier than the buffered clock signal.

8. The device of claim 7, wherein the latency signal generating unit includes:
   a latency signal generator which is initialized in response to the start signal and receives the read command in response to the CAS latency signal, the preamble cycle signal, the buffered clock signal, and the delay clock signal and which is operable to generate a latency signal which is activated earlier by a cycle corresponding to the preamble cycle signal before the data is outputted to the external portion at a cycle corresponding to the CAS latency signal;
   a data strobe latency signal generator for generating the data strobe latency signal which is activated after maintaining an activation period of the latency signal by a cycle obtained by adding a cycle corresponding to the preamble cycle signal to a cycle corresponding to the burst length signal; and
   a data latency signal generator for delaying an activation time point of the data strobe latency signal by the cycle corresponding to the preamble cycle signal to generate a data latency signal.

9. The device of claim 8, wherein the latency signal generator includes:
   a first control signal generator for generating a first control signal corresponding to a cycle obtained by subtracting the cycle corresponding to the preamble cycle signal from a cycle corresponding to the CAS latency signal;
   a second control signal generator for generating a second control signal obtained by adding the cycle corresponding to the preamble cycle signal to a cycle corresponding to the burst length signal;
   a delay for delaying the start signal by the reference time to generate a delayed start signal;
   a first shift register in which an initial value is set in response to the start signal, a shifting bit number of the initial value is determined in response to the first control signal, and a shifting operation is performed in response to the buffered clock signal to generate first shifting output signals;
   a second shift register in which an initial value is set in response to the delayed start signal, a shifting bit number of the initial value is determined in response to the first control signal, and a shifting operation is performed in response to the delay clock signal to generate second shifting output signals;

a first switch for transmitting the read signal in response to the first shifting output signals;

a register for storing a signal outputted from the first switch; and a second switch generating a signal outputted from the register as the latency signal in response to the second shifting output signals.

10. The device of claim 9, wherein the data strobe latency signal generator includes an encoder for encoding a signal corresponding to a cycle obtained by adding a cycle corresponding to the preamble cycle signal to a cycle corresponding to the burst length signal; and a pulse width extender for receiving the latency signal and extending the latency signal by a cycle corresponding to an output signal of the encoder in response to the delay clock signal.

11. The device of claim 10, wherein the data latency signal generator includes a decoder for decoding the preamble cycle signal; and a pulse width reducer for receiving the data strobe latency signal and delaying an activation time point of the data strobe latency signal by a cycle corresponding to an output signal of the decoder in response to the delay clock signal to generate the data latency signal.

12. A latency signal generating method of a semiconductor memory device, the method comprising:

setting a preamble cycle signal in response to a code signal during a mode setting operation, wherein the preamble cycle signal is variably set depending on the operating frequency of the semiconductor memory device.

13. The method of claim 12, further comprising:

generating a data strobe signal which is earlier by a cycle corresponding to the preamble cycle signal before data stored in the semiconductor memory device is output to an external portion in response to the data strobe signal.

14. The method of claim 13, wherein the preamble cycle signal generating step further comprises:

setting a CAS latency signal in response to the code signal, and generating the data strobe signal earlier by the cycle corresponding to the preamble cycle signal before data stored in the memory cell array is outputted to the external portion at a cycle corresponding to the CAS latency signal.

15. The method of claim 14, wherein the preamble cycle signal generating step further comprises:

setting a burst length signal in response to the code signal, and generating the data strobe signal during a cycle obtained by adding a cycle corresponding to the burst length signal to a cycle corresponding to the preamble cycle signal.

16. The method of claim 15, further comprising:

generating the data strobe latency signal which is activated earlier by a cycle corresponding to the preamble cycle signal before the data stored in the memory cell array is outputted to the external portion and which is inactivated after maintaining an activation period of the preamble cycle signal by a cycle obtained by adding a cycle corresponding to the burst length signal to a cycle corresponding to the preamble cycle signal; and generating the data strobe signal by the activation period of the data strobe latency signal in response to the data strobe latency signal.

17. The method of claim 16, wherein the data strobe latency signal generating step comprises:

generating a latency signal which is activated earlier by a cycle corresponding to the preamble cycle signal before data is outputted to the external portion at a cycle corresponding to the CAS latency signal;

generating the data strobe latency signal in response to the latency signal; and generating the data latency signal by delaying an activation time point of the data strobe latency signal by the cycle corresponding to the preamble cycle signal.

18. The method of claim 17, further comprising, decoding an external command signal to generate at least one of a mode setting signal for the mode setting operation and a read signal for the read operation;

generating a delay clock signal synchronized with an external clock signal and generating a start signal when the external clock signal is synchronized with the delay clock signal; and buffering the external clock signal to generate a buffered clock signal.

19. The method of claim 18, wherein the delay clock signal and the buffered clock signal have the same frequency as the external clock signal, and the delay clock signal is generated a reference time earlier than the buffered clock signal.

20. The method of claim 19, wherein the latency signal generating step includes initializing in response to the start signal and receiving the read command in response to the CAS latency signal, the preamble cycle signal, the buffered clock signal, and the delay clock signal.

* * * * *